(12) United States Patent
Gunn et al.

(10) Patent No.: US 11,879,957 B2
(45) Date of Patent: Jan. 23, 2024

(54) SYSTEMS AND METHODS FOR CALIBRATING A TEDS COMPLIANT CONNECTED ENERGY METER

(71) Applicant: SCHNEIDER ELECTRIC USA, INC., Boston, MA (US)

(72) Inventors: Colin N. Gunn, Cowichan Bay (CA); Benedikt Theodor Huber, Victoria (CA)

(73) Assignee: SCHNEIDER ELECTRIC USA, INC., Boston, MA (US)

(*) Notice: Subject to any disclaimer, the term of this patent is extended or adjusted under 35 U.S.C. 154(b) by 50 days.

(21) Appl. No.: 17/496,408

(22) Filed: Oct. 7, 2021

(65) Prior Publication Data
US 2023/0116311 A1 Apr. 13, 2023

(51) Int. Cl.
*G01R 35/04* (2006.01)
*G01R 22/06* (2006.01)

(52) U.S. Cl.
CPC ........... *G01R 35/04* (2013.01); *G01R 22/061* (2013.01)

(58) Field of Classification Search
CPC .............. G01D 4/002; G01D 2204/12; G01D 2204/22; G01D 3/022; G01D 21/00; G01D 4/004; G01D 9/005; G06F 8/61; G06F 8/60; G06F 21/55; G06F 9/4411; G06F 1/1694; G06F 3/04883; G06F 3/002; G06F 1/1686; G06F 11/3006; G06F 11/3409; G06F 3/038; G06F 3/0416; G06F 3/04847; G06F 3/05; G06F 11/00; G06F 11/0772; G06F 13/37; G06F 3/00; G06F 3/0412; H04W 4/50; H04W 4/80; H04W 4/18; H04W 8/22; H04W 52/027; H04W 12/06; H04W 4/38; H04M 1/72403; H04M 2250/52; H04M 2250/04; H04M 1/72412; G01R 19/28;
(Continued)

(56) References Cited

U.S. PATENT DOCUMENTS 6,671,635 B1 * 12/2003 Forth ..................... G01R 35/04
702/62
7,373,356 B2 * 5/2008 Potter .................... G01D 3/022
369/30.01
(Continued)

FOREIGN PATENT DOCUMENTS

CN 102374875 A 3/2012
KR 20100036776 A 4/2010

OTHER PUBLICATIONS

Extended European Search Report from corresponding European Application No. 22198762.1 dated Feb. 20, 2023.
(Continued)

*Primary Examiner* — Vinh P Nguyen
(74) *Attorney, Agent, or Firm* — Lando & Anastasi, LLP

(57) ABSTRACT

According to aspects of the disclosure, a sensing system includes at least one sensor configured to provide an output signal indicative of a sensed property, an interface configured to be coupled to a computing device, and a processor coupled to the interface, the processor being configured to provide, to the computing device via the interface, a first Transducer Electronic Data Sheet (TEDS) template indicative of a first variable of the sensed property, and provide, to the computing device via the interface, a second TEDS template indicative of a second variable of the sensed property.

20 Claims, 7 Drawing Sheets

(58) Field of Classification Search
CPC .... G01R 22/063; G01R 31/086; G01R 25/00; G01R 31/40; G01R 11/25; G01R 31/3274; G01R 31/58; G01R 15/207; G01R 21/133; G01R 22/061; G01R 22/065; G01R 22/10; G01R 27/205; G01R 29/26; G01R 31/307; G01R 31/309; G01R 33/16; G01R 35/005; G01R 35/04; G01F 1/372; G01F 1/66; G01F 1/667; G01F 17/00
See application file for complete search history.

(56) References Cited

U.S. PATENT DOCUMENTS

| | | | | |
|---|---|---|---|---|
| 7,834,754 | B2* | 11/2010 | Kulesz | H04M 11/002 340/517 |
| 7,933,731 | B2* | 4/2011 | Hollander | G01D 3/022 73/1.01 |
| 8,239,158 | B2* | 8/2012 | Crain, II | G06F 5/01 702/123 |
| 9,243,938 | B2* | 1/2016 | Lin | G01D 21/02 |
| 2004/0034658 | A1 | 2/2004 | Potter et al. | |
| 2009/0217755 | A1* | 9/2009 | Hollander | G01D 3/022 73/432.1 |
| 2012/0035869 | A1 | 2/2012 | Lin et al. | |
| 2018/0088159 | A1 | 3/2018 | Heintzelman et al. | |

OTHER PUBLICATIONS

John Mark et al: "The IEEE 1451.4 Standard for Smart Transducers", IEEE Standards Association, Jul. 1, 2004 (Jul. 1, 2004), pp. 1-14, XP055528479, Retrieved from the Internet: URL:https://standards.ieee.org/content/dam/ieee-standards/standards/web/documents/tutorials/1451d4.pdf [retrieved on Nov. 29, 2018].

Kang Jim et al: "Extension of the IEEE 1451 Standards to Geophysical Assessment", 2021 IEEE Sensors Applications Symposium (SAS), IEEE, Aug. 23, 2021 (Aug. 23, 2021), pp. 1-6, XP033971648, DOI: 10.1109/SAS51076.2021.9530073 [retrieved on Sep. 3, 2021].

* cited by examiner

| Select | Property | Description | Access | Bits | Data Type (and Range) | Units |
|---|---|---|---|---|---|---|
| - | %MapMeth | Mapping Method | ID | - | Assign = 0, "Linear" | - |
| - | %ACDCCoupling | AC or DC coupling | ID | 1 | DC or AC | - |
| - | %SensorImped | Sensor output impedance | ID | 12 | ConRelRes (1 to 1.1M, ±0.17%) | Ohms |
| - | %RespTime | Response time | ID | 6 | ConRelRes (1E-6 to 7.9, ±15%) | seconds |
| Select Case – Selects Inclusion of Excitation/Power Requirements | | | | 1 | Select Case | |
| Case 0 (none) | - | No power supply/excitation source | - | - | | - |
| Case 1 (specify supply) | %ExciteAmp1Nom | Power supply level, nominal | ID | 9 | ConRes (0.1 to 51.1, step 0.1) | Volts |
| | %ExciteAmp1Min | Power supply level, min. | ID | 9 | ConRes (0.1 to 51.1, step 0.1) | Volts |
| | %ExciteAmp1Max | Power supply level, max. | ID | 9 | ConRes (0.1 to 51.1, step 0.1) | Volts |
| | %ExciteType | Power supply type | ID | 2 | DC, Bipolar DC, or AC | - |
| | %ExciteCurrentDraw | Max current at nom. power | ID | 6 | ConRelRes (1E-6 to 1.6, ±13%) | Amps |
| - | %CalDate | Calibration date | CAL | 16 | DATE | - |
| - | %CalInitials | Calibration initials | CAL | 15 | CHR5 | - |
| - | %CalPeriod | Calibration period | CAL | 12 | UINT | Days |
| - | %MeasID | Measurement location ID | USR | 11 | UINT | - |

FIG. 2B

| Property | Description | Bits | Data Type (and Range) |
|---|---|---|---|
| TEMPLATE | Template ID | 8 | Integer (value = 40) |
| %CalTable_Domain | Domain parameter | 1 | Electrical or physical |
| STRUCTARRAY CalTable | Number of data pairs (n) | 7 | Size from 1 to 127 |
| %CalPoint_DomainValue (0) | Domain Cal Point 0 (% of full span) | 16 | ConRes (0 to 100%, step 0.0015) |
| %CalPoint_RangeValue (0) | Range Cal Deviation 0 (% of full span) | 21 | ConRes (-100 to 100, step 1E-4) |
| %CalPoint_DomainValue (1) | Domain Cal Point 1 (% of full span) | 16 | ConRes (0 to 100%, step 0.0015) |
| %CalPoint_RangeValue (1) | Range Cal Deviation 1 (% of full span) | 21 | ConRes (-100 to 100, step 1E-4) |
| ... | ... | ... | ... |
| %CalPoint_DomainValue (n) | Domain Cal Point n (% of full span) | 16 | ConRes (0 to 100%, step 0.0015) |
| %CalPoint_RangeValue (n) | Range Cal Deviation n (% of full span) | 21 | ConRes (-100 to 100, step 1E-4) |

SYSTEMS AND METHODS FOR CALIBRATING A TEDS COMPLIANT CONNECTED ENERGY METER

BACKGROUND

1. Field of the Disclosure

At least one example in accordance with the present disclosure relates generally to sensors and exchanging sensor data.

2. Discussion of Related Art

Sensors are electronic devices configured to sense one or more physical properties. Sensors provide output signals indicative of the one or more sensed properties. The output signals may include data encoding the one or more sensed properties. A device receiving the output signals, such as a computing device, may require certain information to decode the encoded properties. Such information may include calibration information, for example.

SUMMARY

According to at least one aspect of the present disclosure, a sensing system includes at least one sensor configured to provide an output signal indicative of a sensed property, an interface configured to be coupled to a computing device, and a processor coupled to the interface, the processor being configured to provide, to the computing device via the interface, a first Transducer Electronic Data Sheet (TEDS) template indicative of a first variable of the sensed property, and provide, to the computing device via the interface, a second TEDS template indicative of a second variable of the sensed property.

In some examples, the at least one sensor includes at least one of a current sensor or a voltage sensor. In various examples, the first variable includes a current phase. In at least one example, the second variable includes a current magnitude. In some examples, the first variable includes a voltage phase. In various examples, the second variable includes a voltage magnitude. In at least one example, each of the first TEDS template and the second TEDS template is a high-level voltage output sensor TEDS template. In some examples, the processor is further configured to provide, to the computing device via the interface, at least one TEDS calibration template.

In various examples, the processor is further configured to provide, to the computing device via the interface, a first TEDS calibration template indicative of the first variable of the sensed property, and provide, to the computing device via the interface, a second TEDS calibration template indicative of the second variable of the sensed property. In at least one example, each of the first TEDS calibration template and the second TEDS calibration template is a calibration table TEDS template. In some examples, the first TEDS template is paired with the first TEDS calibration template, and wherein the second TEDS template is paired with the second TEDS calibration template. In various examples, the at least one sensor is further configured to send the output signal to the computing device via the interface.

According to at least one example, a non-transitory computer-readable medium storing thereon sequences of computer-executable instructions for operating a sensing system being coupled to a computing device and including at least one sensor configured to provide an output signal indicative of a sensed property is provided, the sequences of computer-executable instructions including instructions that instruct at least one processor to provide, to the computing device, a first Transducer Electronic Data Sheet (TEDS) template indicative of a first variable of the sensed property, and provide, to the computing device, a second TEDS template indicative of a second variable of the sensed property.

In some examples, the first variable includes a current phase and the second variable includes a current magnitude. In at least one example, the first variable includes a voltage phase and the second variable includes a voltage magnitude. In various examples, each of the first TEDS template and the second TEDS template is a high-level voltage output sensor TEDS template. In some examples, the instructions further instruct the at least one processor to provide, to the computing device, a first TEDS calibration template indicative of the first variable of the sensed property, and provide, to the computing device, a second TEDS calibration template indicative of the second variable of the sensed property. In at least one example, each of the first TEDS calibration template and the second TEDS calibration template is a calibration table TEDS template.

According to at least one example, a method of operating a sensing system being coupled to a computing device and including at least one sensor is provided, the method comprising providing an output signal from the at least one sensor indicative of a sensed property, providing, to the computing device, a first Transducer Electronic Data Sheet (TEDS) template indicative of a first variable of the sensed property, and providing, to the computing device, a second TEDS template indicative of a second variable of the sensed property.

In some examples, the method includes providing, to the computing device, a first TEDS calibration template indicative of the first variable of the sensed property, the first TEDS calibration template being paired with the first TEDS template, and providing, to the computing device, a second TEDS calibration template indicative of the second variable of the sensed property, the second TEDS calibration template being paired with the second TEDS template.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIGS. 2A and 2B illustrate respective sections of a table of TEDS high-level voltage output template fields;

FIG. 3 illustrates a table of a calibration template capable of being paired with the high-level voltage output template of FIGS. 2A and 2B;

DETAILED DESCRIPTION

Figure 1:
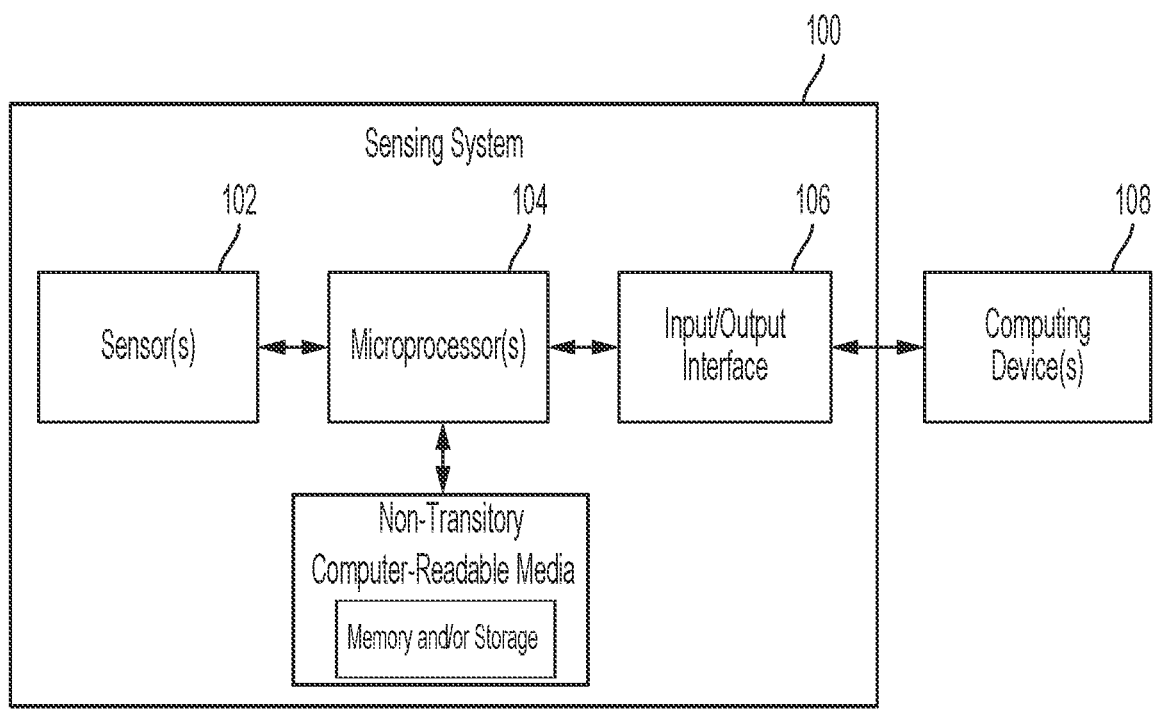
FIG. 1 illustrates a block diagram of a sensing system according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Sensors are configured to sense one or more physical properties and output a signal indicative of the one or more physical properties. Known sensors include current sensors, voltage sensors, temperature sensors, accelerometers, microphones, and a wide range of other sensors. A physical property sensed by a sensor may vary depending on a type of the sensor. For example, a physical property sensed by a temperature sensor may include heat, and a physical property sensed by a current sensor may include a magnetic field generated by a current.

Sensors provide output signals encoding the sensed information. The sensor may interface with a computing device to which the sensor provides the output signals for analysis or review, such as by a user. To enable the computing device to process output signals received from the sensor, the computing device may need certain information about the sensor. Such information may include information indicating a manufacturer of the sensor, a model number of the sensor, a serial number of the sensor, calibration information for the sensor, and so forth.

It may be advantageous for the sensor to provide this information directly to the computing device rather than a user manually entering such information into the computing device. Such "plug-and-play" functionality enables a computing device to begin interfacing with a sensor shortly after installation, without requiring a user to expend significant time and energy providing the information to the computing device. Plug-and-play functionality may be achieved through implementation of a standardized Transducer Electronic Data Sheet (TEDS) device.

A TEDS device is a memory device that is integrated with a sensor, or "transducer." The TEDS device stores information about the sensor, such as manufacturer information, model information, calibration-date information, calibration information, and so forth. The TEDS device provides the stored information to a computing device upon initially communicating with the computing device to enable the computing device to quickly and easily interface with the transducer. The stored information is provided according to a standardized format corresponding to a type of transducer. For example, a first standardized TED format is provided for microphone-type transducers, a second standardized TED format is provided for thermistor-type transducers, and so forth.

Information stored in a TEDS device includes four groups of information. A first group of information includes basic TEDS information that may be considered universal amongst various types of transducers. Such basic TEDS information describes aspects of a transducer including a manufacturer identification number, a model number, a version letter, a version number, and a serial number. A second group of information includes an identifier of one of several standardized templates of information specific to a particular type of transducer. For example, the second group of information may identify a standardized template for an accelerometer or force transductor, a capacitive microphone transducer, a high-level voltage output sensor, and so forth. Approximately sixteen such standardized templates currently exist. A third group of information includes an identifier of a standardized calibration TEDS template, which may indicate a calibration table, a polynomial calibration curve, or a frequency-response table. A fourth group of information may include a user area in which additional custom information may be added by a user.

TEDS devices may therefore be advantageous to implement in connection with a transducer. However, as discussed above, only approximately sixteen standardized TEDS templates exist, each corresponding to a respective type of transducer. Although the transducers corresponding to these templates may take advantage of a TEDS device (and are therefore considered "TEDS-compliant"), transducers for which no corresponding standardized template exists may not be easily able to implement a TEDS device. For example, current and voltage sensors may not be TEDS-compliant at least because no standardized TEDS template exists specifically for current and voltage sensors. Although certain types of TEDS templates, such as a high-level voltage output sensor TEDS template, may partially describe a current or voltage sensor, the information presented by the TEDS template may be incomplete. For example, although a high-level voltage output sensor TEDS template may describe a voltage magnitude or a voltage phase, the template may be unable to describe both and therefore may be unable to fully describe a voltage sensor. Voltage sensors (and, similarly, current sensors) may therefore not be TEDS compliant, and plug-and-play functionality may be limited for such non-TEDS-compliant transducers, that is, transducers for which a complete TEDS template has not already been created.

Existing sensing systems, such as energy-metering systems, may implement sensors, including voltage and current sensors, that are not TEDS compliant. Such non-TEDS-compliant systems may operate inefficiently, because initializing the system to enable a computing device to interface with one or more sensors of the system is time-intensive and requires significant knowledge and manual effort by a user. This is a technical problem. An exemplary embodiment of a sensing system provides a computing element, such as a microprocessor, configured to provide an emulated memory TEDS device by sending complete TEDS information for non-TEDS-compliant transducers. At least this foregoing combination of features comprises a sensing system that serves as a technical solution to the foregoing technical problem. This technical solution is not routine and is unconventional. This technical solution is a practical application of the sensing system design that solves the foregoing technical problem and constitutes an improvement in the technical field of sensing systems, including energy-metering systems, at least by providing TEDS compliance to sensors for which no complete TEDS template exists.

Examples of the disclosure provide an emulated TEDS device for non-TEDS-compliant transducers, such as current and voltage transducers. A sensor or sensing device may include at least one microprocessor emulating a TEDS device. The microprocessor may send multiple cascaded TEDS templates for a single sensor. For example, the microprocessor may send a first TEDS template descriptive of a magnitude of a sensed property, such as a voltage or current magnitude, and a second TEDS template descriptive of a phase of a sensed property, such as a voltage or current phase. In some examples, the TEDS templates may each be paired with a respective calibration template when parameter calibration is desired. Accordingly, by using existing TEDS templates, an emulated TEDS device may be implemented in connection with a transducer for which a standardized TEDS template is not available.

FIG. 1 illustrates a block diagram of a sensing system 100 according to an example. The sensing system 100 may be a device or devices configured to sense one or more parameters. In one example, the sensing system 100 may be an energy meter configured to measure an amount of energy consumed by a device or devices. For example, the sensing system 100 may be a split-core transformer configured to couple to a conductor and sense a current through, and/or voltage across, the conductor. It is to be appreciated, however, that the sensing system 100 may be implemented as any other sensing device or devices and that examples of the disclosure are not limited to energy-metering devices.

The sensing system 100 includes one or more sensors 102 ("sensors 102"), one or more microprocessors 104 ("microprocessor 104"), and at least one input and/or output interface 106 ("interface 106"). The sensing system 100 is configured to be coupled to at least one external computing device 108 ("computing device 108"). The sensing system 100 may further be configured to be coupled to one or more external devices, such as an energy conductor, for which the sensing system 100 is configured to sense one or more physical properties, such as a voltage, current, or other physical property indicative thereof. It is to be appreciated that the sensing system 100 may include additional components, such as power-supply components and/or connectors, user-interface elements, power-conditioning and/or power-conversion components, and so forth, which are omitted for purposes of explanation.

The sensors 102 are communicatively coupled to the microprocessor 104. The microprocessor 104 is communicatively coupled to the sensors 102 and to the interface 106. The interface 106 is communicatively coupled to the microprocessor 104, and is configured to be communicatively coupled to the computing device 108. In some examples, the sensors 102 may be coupled to the interface 106 directly.

The sensors 102 may include one or more types of sensors. For example, the sensors 102 may include one or more voltage sensors, one or more current sensors, one or more temperature sensors, such as thermistors, and so forth. The sensors 102 may sense physical properties and send output signals indicative of the physical properties to the microprocessor 104. The microprocessor 104 may process the output signals and provide information indicative of the sensed properties to the computing device 108 via the interface 106. The interface 106 may include a wired and/or wireless communication interface. For example, the interface 106 may include an RJ45-8 interface to couple to the computing device 108. In some examples, the interface 106 may include a one-wire interface configured to exchange power and data on one wire (in addition to a return or common wire, in some examples) between the microprocessor 104 and the computing device 108. The computing device 108 may be, or be accessible to, a user desiring to view or analyze the sensed information.

Figure 6:
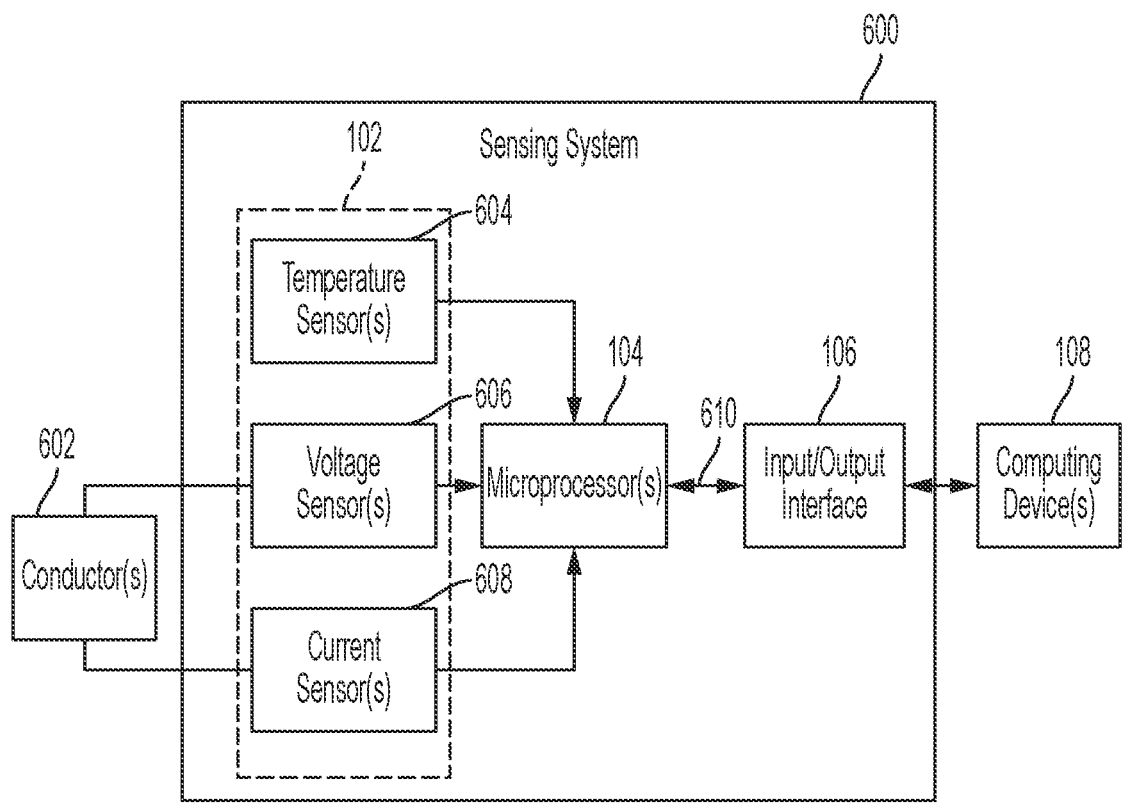
FIG. 6 illustrates a block diagram of a sensing system according to an example.

FIG. 6 illustrates a sensing system 600 according to an example. The sensing system 600 may be an example implementation of the sensing system 100, and like components are labeled accordingly. In one example, the sensing system 600 includes a split-core transformer configured to be coupled to, and sense one or more properties of, a conductor 602. For example, the conductor 602 may conduct an electrical signal, and the sensing system 600 may be configured to sense one or more properties of the electrical signal. Accordingly, the sensing system 600 may provide power-metering functionality by measuring properties of an electrical signal conducted by the conductor 602.

The sensing system 600 includes the sensors 102, the microprocessor 104, and the interface 106. The sensors 102 include one or more temperature sensors 604 ("temperature sensor 604"), one or more voltage sensors 606 ("voltage sensor 606"), and one or more current sensors 608 ("current sensor 608").

The temperature sensor 604 is coupled to the microprocessor 104. The voltage sensor 606 is coupled to the microprocessor 104, and is configured to sense one or more voltage properties of the conductor 602. The current sensor 608 is coupled to the microprocessor 104, and is configured to sense one or more current properties of the conductor 602. The microprocessor 104 is coupled to the sensors 604-608, and is configured to be coupled to the interface 106 via a one-wire connection 610. In various examples, the sensors 604-608 may receive power from the microprocessor 104. In other examples, the sensors 604-608 may not be coupled to the microprocessor 104. The sensors 604-608 may be coupled directly to the interface 106 (not illustrated for purposes of clarity), and may each provide a respective output signal (for example, indicative of a sensed property) to the interface 106, bypassing the microprocessor 104.

Power and data may be transmitted via the one-wire connection 610, which may include a single conductor (for example, in addition to a neutral or ground common return conductor). For example, the interface 106 may provide power to the microprocessor 104 via the one-wire connection 610, and the microprocessor 104 may provide and receive data to and from the interface 106 via the one-wire connection 610. The interface 106 is coupled to the microprocessor 104 via the one-wire connection 610, and is configured to be coupled to the computing device 108. The microprocessor 104 may be configured to provide TEDS information to the interface 106 via the one-wire connection 610.

As discussed above, the conductor 602 may conduct an electrical signal. The sensing system 600 may include a split-core transformer configured to couple around a circumference of the conductor 602. The temperature sensor 604 may be configured to sense an ambient temperature at or around the conductor 602, and send a temperature-sense signal to the microprocessor 104 indicative of the sensed temperature. The voltage sensor 606 may be electrically coupled to the conductor 602 (for example, by sensing an electric field provided by the conductor 602) and be configured to sense a voltage across at least a portion of the conductor 602 and send a voltage-sense signal to the microprocessor 104 indicative of a voltage across the at least a portion of the conductor 602. For example, the voltage-sense signal may indicate whether the conductor 602 is presently energized (for example, conducting an electrical signal) by detecting a voltage drop sensed by the voltage sensor 606. The current sensor 608 may be magnetically coupled to the conductor 602 and be configured to sense a current conducted by the conductor 602 and send a current-sense signal to the microprocessor 104 (or, in some examples, directly to the interface 106) indicative of a current conducted by the conductor 602. For example, the current sensor 608 may include a current transformer configured to be inductively coupled to the conductor 602 and to output an induced current responsive to a magnetic field produced by a current through the conductor 602.

As discussed above, although a TEDS device may advantageously enable a computing device, such as the computing device 108, to interface with a sensor, such as the sensors 102, a TEDS device may provide no or limited benefit to sensors for which no standardized TEDS template exists. Accordingly, if the sensors 102 include non-TEDS-compliant sensors, such as current or voltage sensors (for example, the voltage sensor 606 and/or current sensor 608), it may be more difficult for the computing device 108 to interface with the sensing system 100.

In various examples, the microprocessor 104 is configured to emulate a TEDS memory device. The microprocessor 104 emulates a TEDS device by providing TEDS information to the computing device 108 in a similar manner to a legacy TEDS device. As discussed above, TEDS information includes, amongst other information, a TEDS template for a respective sensor type and a calibration template paired to the TEDS template. For certain sensors for which a standardized TEDS template is not available, such as current or voltage sensors, the microprocessor 104 may provide multiple cascaded high-level voltage output sensor TEDS templates and paired calibration templates to fully describe a sensor. In some examples, the microprocessor 104 provides the TEDS information via a one-wire connection (for example, the one-wire connection 610).

Figure 2A:

FIGS. 2A and 2B illustrate a table 200 of the high-level voltage output template fields. FIG. 2A illustrates a "top" portion of the table 200, and FIG. 2B illustrates a "bottom" portion of the table 200. The table 200 extends continuously from FIG. 2A to FIG. 2B and is illustrated in separate figures for purposes of clarity. The high-level voltage output template, having a TEDS template ID of 30, is a general-purpose template capable of being used with various types of sensors, including sensors having an analog voltage as an output signal. A sensor type may be specified using the first 6-bit Select Case field 202, which indicates a physical measurand (for example, a voltage magnitude, a voltage phase, a current magnitude, a current phase, and so forth) and corresponding units thereof (for example, volts, amperes, degrees, radians, and so forth).

FIG. 3 illustrates a table 300 of a TEDS calibration table capable of being paired with the high-level voltage output template of FIGS. 2A and 2B. The calibration table, having a TEDS template ID of 40, may be used in conjunction with the high-level voltage output template, and specifies calibration information about a respective sensor such as input-versus-output information. The calibration template may include an arbitrary number n of data pairs indicating a physical-property input sensed by a sensor and an output-signal output provided by the sensor based on the physical-property input. In some examples, the calibration template provides the information according to a piecewise linear-interpolation scheme.

As discussed above, the high-level voltage output template and paired calibration template may not be appropriate for physical properties having multiple parameters, such as voltage or current having both a magnitude and a phase, because the template may be designed only for a single parameter (for example, as specified by the Select Case field 202). Examples of the disclosure implement multiple high-level voltage output templates and paired calibration templates cascaded together. For example, in establishing a connection between a sensor of the sensors 102 and the computing device 108, the microprocessor 104 may send a first template and paired calibration template descriptive of a magnitude of a sensed property, and a second template and paired calibration template descriptive of a phase of the sensed property, for a total of four templates. Accordingly, the cascaded templates may provide the computing device 108 with substantially all information necessary to initialize a connection with applicable sensors of the sensors 102.

Figure 4:
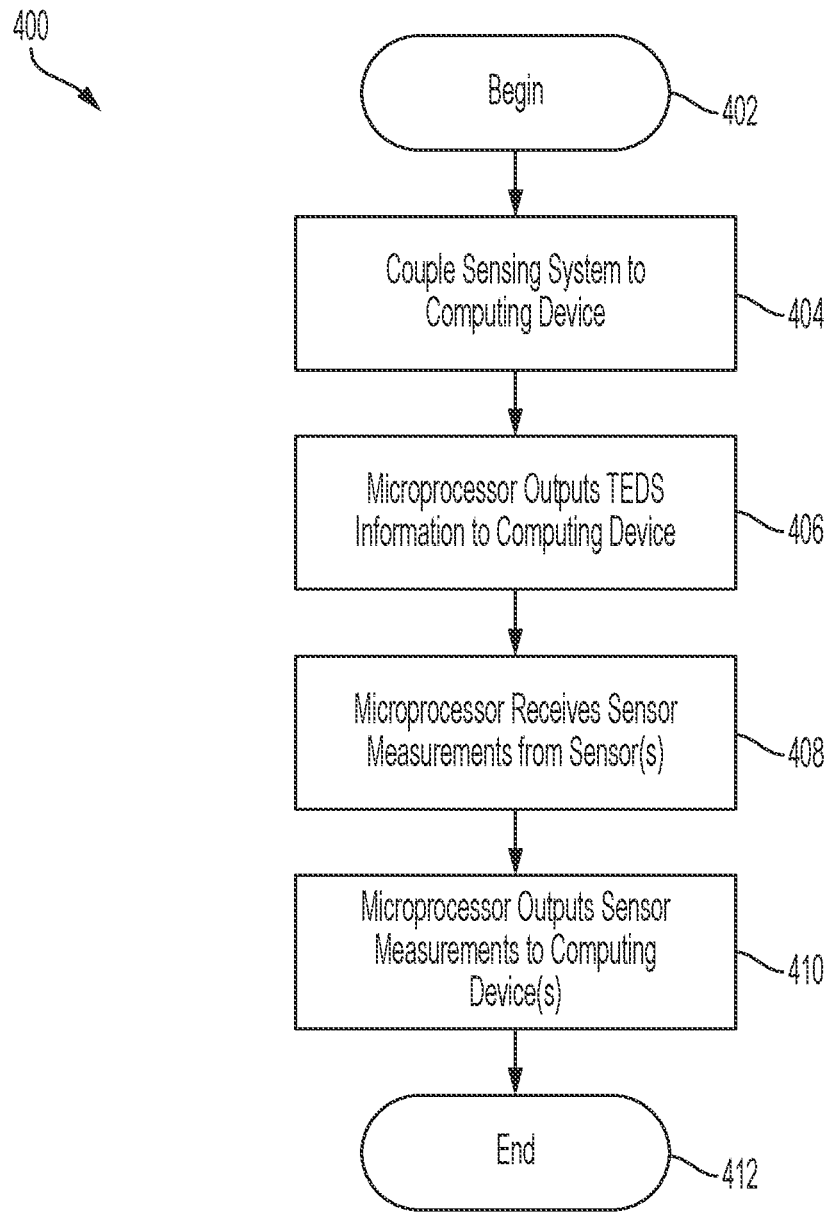
FIG. 4 illustrates a process of operating the sensing system of FIG. 1 according to an example.

FIG. 4 illustrates a process 400 of operating the sensing system 100 according to an example. The process 400 may be executed, for example, when the sensing system 100 is first used and/or first connected to the computing device 108 in some examples.

At act 402, the process 400 begins.

At act 404, the sensing system 100 is coupled to the computing device 108 via the interface 106. In some examples, the sensing system 100 is coupled to the computing device 108 by coupling a wired connector, such as an RJ45-8 connector, to the interface 106 and to the computing device 108. Power and/or data may be exchanged through the connection between the interface 106 and the computing device 108. In some examples, act 404 may include an initial coupling between the sensing system 100 and the computing device 108 when the sensing system 100 is first used by a user, for example.

At act 406, the microprocessor 104 outputs TEDS information, including one or more TEDS templates, to the computing device 108. Act 406 may include providing multiple TEDS templates, as well as associated calibration templates, for a single sensor type. Moreover, act 406 may include providing TEDS templates and associated calibration templates for multiple sensor types. An example of act 406 is provided with respect to FIG. 5. The computing device 108 may be capable of interfacing with the sensing system 100 and receiving sensor information from the sensing system 100 after act 406 is completed.

At act 408, the microprocessor 104 receives sensor-measurement information from the sensors 102. The sensors 102 may include multiple types of sensors, such as current sensors configured to provide current-measurement information, voltage sensors configured to provide voltage-measurement information, temperature sensors configured to provide temperature-measurement information, and so forth, each configured to sense a respective physical property at the same or different rates and/or intervals. The sensors 102 may provide output signals to the microprocessor 104 simultaneously or at different times. The microprocessor 104 may receive sensor-measurement information from fewer than all of the sensors 102 at certain times, and may receive sensor measurement information from all of the sensors 102 at other times.

At act 410, the microprocessor 104 outputs the sensor-measurement information, or information indicative thereof, to the computing device 108. The microprocessor 104 may process the sensor-measurement information received at act 408 and output processed information indicative of the sensor measurement information to the computing device 108. The microprocessor 104 may send information to the computing device 108 in real-time as sensor-measurement information is received, or at periodic or aperiodic intervals. At least because the computing device 108 has received TEDS information indicative of the sensors 102 providing the sensor-measurement information, the computing device 108 is equipped to easily interface with the sensors 102 and the sensor-measurement information.

At act 412, the process 400 ends.

Modifications to the process 400 are within the scope of the disclosure. For example, act 408 may instead include the sensors 102 providing output signals directly to the interface 106 in some examples. Similarly, act 410 may include the sensors 102 providing the output-measurement information to the computing device 108 via the interface 106. Accordingly, in various examples, the microprocessor 104 may be configured to provide TEDS information to the computing device 108, but may otherwise not provide information, such as output-measurement information, to the computing device 108.

Figure 5:
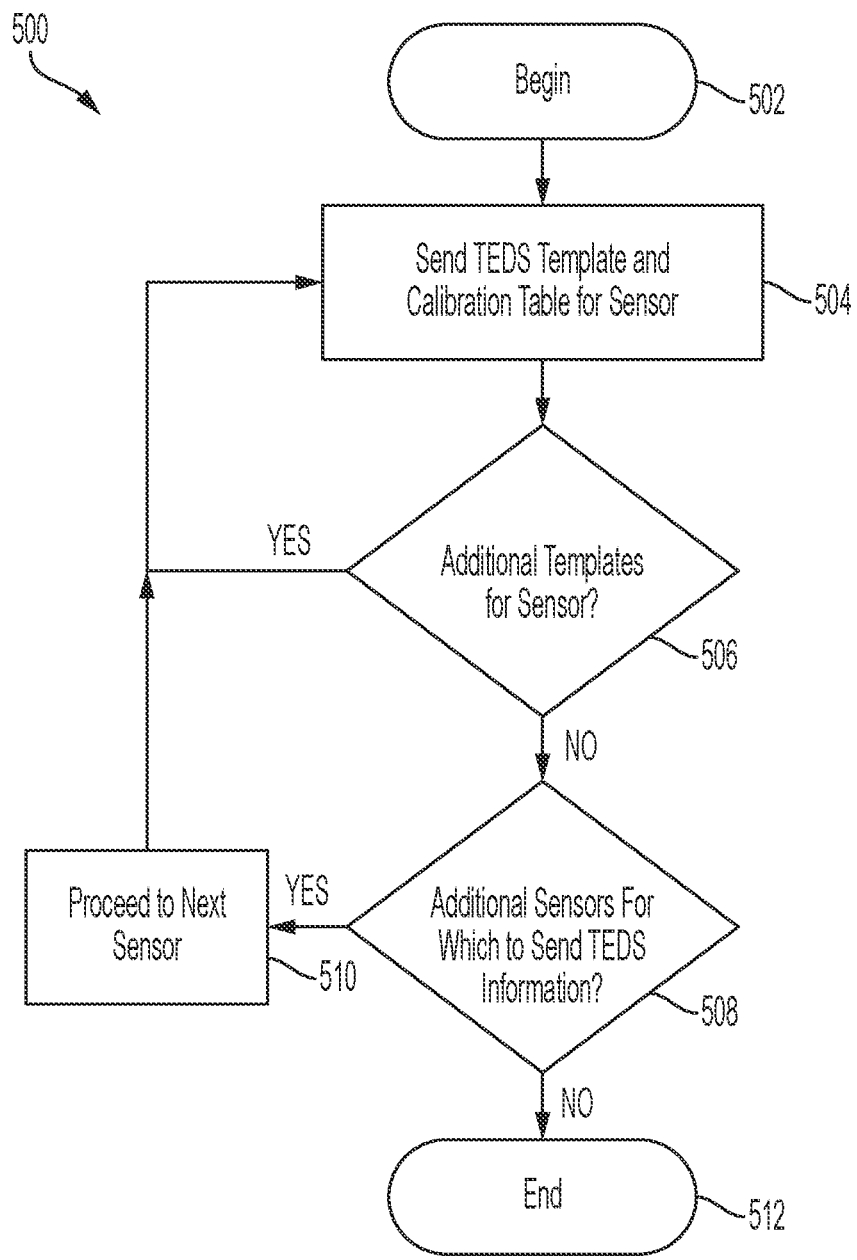
FIG. 5 illustrates a process of outputting TEDS information from the sensing system of FIG. 1 to a computing device according to an example.

FIG. 5 illustrates a process 500 of outputting TEDS information, which may include at least one TEDS template and at least one paired calibration template, from the sensing system 100 to the computing device 108 according to an example. The process 500 may be an example of act 406.

At act 502, the process 500 begins.

At act 504, the microprocessor 104 sends a TEDS template and a paired calibration template for a respective sensor to the computing device 108. If the sensor is one for which a single TEDS template and single paired calibration template already exist and fully describe the sensor, the computing device 108 may be capable of interfacing with the sensor based on the TEDS template and paired calibration template. Otherwise, if the sensor is not one for which a single TEDS template and single paired calibration template already exist, such as a voltage or current sensor, the computing device 108 may need additional information to interface with the sensor. For example, act 504 may include the microprocessor 104 sending a first TEDS template and paired calibration template to describe a magnitude of a sensor measurement, and a second TEDS template and paired calibration template to describe a phase of a sensor measurement.

At act 506, the microprocessor 104 determines whether additional templates should be sent for the respective sensor. If the sensor is one for which a single TEDS template and single paired calibration template already exist and fully describe the sensor, such as a thermistor, the microprocessor 104 may determine that the single TEDS template and single paired calibration template sent to the computing device 108 at act 504 are sufficient to enable the computing device 108 to interface with the respective sensor and that no additional templates are necessary for the sensor (506 NO). The process 500 then proceeds to act 508.

Otherwise, if no single TEDS template and paired calibration template already exist and fully describe the sensor, the microprocessor 104 may determine that additional templates and/or calibration templates should be sent to the computing device 108 (506 YES). A sensor that senses a property having multiple variables, such as a current or voltage having a phase and a magnitude, may not be fully described by a single TEDS template and paired calibration template. For example, if the sensor is a current or voltage sensor, a single TEDS template and paired calibration template may be insufficient to enable the computing device 108 to interface with the sensor. Accordingly, if additional templates with paired calibration templates are to be sent for the sensor (506 YES), the process 500 returns to act 504 to send at least one additional template and paired calibration template. Acts 504 and 506 are repeatedly executed such that cascaded TEDS templates and calibration templates are sent until a determination is made at act 506 that no additional templates with paired calibration templates are to be sent to the computing device 108 for the sensor (506 NO), and the process 500 continues to act 508. It is to be appreciated that fewer or greater than two pairs of templates may be sent to the computing device 108 for a single sensor.

At act 508, a determination is made as to whether additional sensors exist for which to send additional TEDS templates with paired calibration templates. For example, if the microprocessor 104 has already sent TEDS templates with paired calibration templates for a voltage sensor but not for a current sensor, then the microprocessor 104 may determine that additional sensors exist for which to send TEDS information (508 YES). The process 500 continues to act 510.

At act 510, the microprocessor 104 proceeds to the next sensor. For example, the microprocessor 104 may proceed to a next sensor for which additional TEDS information is to be sent. The process 500 then returns to act 504, and acts 504-508 are repeatedly executed until a determination is made that there are no additional sensors for which to send TEDS information (508 NO). The process 500 then continues to act 512.

At act 512, the process 500 ends.

An example of the process 500 is provided for purposes of explanation. In the following example, the sensors 102 include a temperature sensor, a voltage sensor, and a current sensor. At act 504, the microprocessor 104 sends a TEDS template and paired calibration template for the temperature sensor, arbitrarily selected as a first sensor for which to send TEDS information. For example, the temperature sensor may be implemented as a thermistor, and the TEDS information may include a thermistor TEDS template (ID number 38) and a paired calibration table (ID number 40). The TEDS information may additionally include basic TEDS information and any user data, as discussed above.

At act 506, the microprocessor 104 determines that no additional TEDS templates are necessary for the temperature sensor (506 NO) at least because the single TEDS template and paired calibration table fully describe the temperature sensor and enable the computing device 108 to interface with the temperature sensor. At act 508, the microprocessor 508 determines that additional sensors exist for which to send TEDS information (508 YES), including the current and voltage sensors. At act 510, the microprocessor 104 proceeds to the voltage sensor, arbitrarily selected as a second sensor for which to send TEDS information.

Returning to act 504, the microprocessor 104 sends a first TEDS template and paired calibration template for the voltage sensor to the computing device 108. For example, the first TEDS template and paired calibration table may correspond to a voltage magnitude. As discussed above with respect to FIGS. 2 and 3, the microprocessor 104 may send a high-level voltage output sensor template (ID number 30) and a paired calibration table (ID number 40) for the voltage magnitude. At act 506, the microprocessor 104 may determine that additional TEDS templates are to be sent for the voltage sensor. Returning to act 504, the microprocessor 104 sends a second TEDS template and paired calibration template, cascaded with the first TEDS template and paired calibration template, for the voltage sensor to the computing device 108. For example, the second TEDS template and paired calibration table may correspond to a voltage phase. As discussed above with respect to FIGS. 2 and 3, the microprocessor 104 may send a high-level voltage output sensor template (ID number 30) and a paired calibration table (ID number 40) for the voltage phase. Although in this example the microprocessor 104 sends TEDS information for the voltage magnitude before TEDS information for the voltage phase, in other examples the TEDS information for the voltage phase may be sent prior to the TEDS information for the voltage magnitude.

At act 506, the microprocessor 104 determines that the first TEDS information and the cascaded second TEDS information are sufficient to enable the computing device 108 to interface with the voltage sensor, and that no additional templates are to be sent to the computing device 108 for the voltage sensor (506 NO). At act 508, the microprocessor 104 determines that there are additional sensors for which to send TEDS information (508 YES). At act 510, the microprocessor 104 proceeds to the current sensor, arbitrarily selected as a third sensor for which to send TEDS information.

Returning to act 504, the microprocessor 104 sends a first TEDS template and paired calibration template for the current sensor to the computing device 108. For example, the first TEDS template and paired calibration table may correspond to a current magnitude. As discussed above with respect to FIGS. 2 and 3, the microprocessor 104 may send a high-level voltage output sensor template (ID number 30) and a paired calibration table (ID number 40) for the current magnitude. At act 506, the microprocessor 104 may determine that additional TEDS templates are to be sent for the current sensor. Returning to act 504, the microprocessor 104 sends a second TEDS template and paired calibration template, cascaded with the first TEDS template and paired calibration template, for the current sensor to the computing device 108. For example, the second TEDS template and paired calibration table may correspond to a current phase. As discussed above with respect to FIGS. 2 and 3, the microprocessor 104 may send a high-level voltage output sensor template (ID number 30) and a paired calibration table (ID number 40) for the current phase. Although in this example the microprocessor 104 sends TEDS information for the current magnitude before TEDS information for the current phase, in other examples the TEDS information for the current phase may be sent prior to the TEDS information for the current magnitude.

At act 506, the microprocessor 104 determines that the first TEDS information and the cascaded second TEDS information are sufficient to enable the computing device 108 to interface with the current sensor, and that no additional templates are to be sent to the computing device 108 for the current sensor (506 NO). At act 508, the microprocessor 104 determines that there are no additional sensors for which to send TEDS information (508 NO). At act 512, the process 500 ends, and the computing device 108 is capable of interfacing with the sensors 102.

Various processors, such as the microprocessor 104, may execute various operations discussed above. Using data stored in associated memory and/or storage, the microprocessor 104 also executes one or more instructions stored on one or more non-transitory computer-readable media, which may be coupled to the microprocessor 104, which may result in manipulated data. In some examples, the microprocessor 104 may include one or more processors and/or controllers. In one example, the microprocessor 104 is or includes at least one processor. In another example, the microprocessor 104 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A sensing system comprising:
   a sensor configured to provide an output signal indicative of a sensed property;
   an interface configured to be coupled to a computing device;
   memory and/or storage configured to store one or more instructions; and
   a processor coupled to the interface and to the memory and/or storage, the processor being configured, responsive to executing the one or more instructions, to:
   provide, to the computing device via the interface an initialization period before the sensor provides the output signal, a first Transducer Electronic Data Sheet (TEDS) template indicative of a first variable of the sensed property; and
   provide, to the computing device via the interface an initialization period before the sensor provides the output signal, a second TEDS template indicative of a second variable of the sensed property.

2. The sensing system of claim 1, wherein the sensor includes a current sensor or a voltage sensor.

3. The sensing system of claim 1, wherein the first variable includes a current phase.

4. The sensing system of claim 3, wherein the second variable includes a current magnitude.

5. The sensing system of claim 1, wherein the first variable includes a voltage phase.

6. The sensing system of claim 5, wherein the second variable includes a voltage magnitude.

7. The sensing system of claim 1, wherein each of the first TEDS template and the second TEDS template is a high-level voltage output sensor TEDS template.

8. The sensing system of claim 1, wherein the processor is further configured to provide, to the computing device via the interface an initialization period before the sensor provides the output signal, at least one TEDS calibration template.

9. The sensing system of claim 8, wherein the processor is further configured to:
provide, to the computing device via the interface an initialization period before the sensor provides the output signal, a first TEDS calibration template indicative of the first variable of the sensed property; and
provide, to the computing device via the interface an initialization period before the sensor provides the output signal, a second TEDS calibration template indicative of the second variable of the sensed property.

10. The sensing system of claim 9, wherein each of the first TEDS calibration template and the second TEDS calibration template is a calibration table TEDS template.

11. The sensing system of claim 10, wherein the first TEDS template is paired with the first TEDS calibration template, and wherein the second TEDS template is paired with the second TEDS calibration template.

12. The sensing system of claim 1, wherein the sensor is further configured to send the output signal to the computing device via the interface.

13. A non-transitory computer-readable medium storing thereon sequences of computer-executable instructions for operating a sensing system being coupled to a computing device and including a sensor configured to provide an output signal indicative of a sensed property, the sequences of computer-executable instructions including instructions that instruct at least one processor to:
provide, to the computing device an initialization period before the sensor provides the output signal, a first Transducer Electronic Data Sheet (TEDS) template indicative of a first variable of the sensed property; and
provide, to the computing device an initialization period before the sensor provides the output signal, a second TEDS template indicative of a second variable of the sensed property.

14. The non-transitory computer-readable medium of claim 13, wherein the first variable includes a current phase and the second variable includes a current magnitude.

15. The non-transitory computer-readable medium of claim 13, wherein the first variable includes a voltage phase and the second variable includes a voltage magnitude.

16. The non-transitory computer-readable medium of claim 13, wherein each of the first TEDS template and the second TEDS template is a high-level voltage output sensor TEDS template.

17. The non-transitory computer-readable medium of claim 13, wherein the instructions further instruct the at least one processor to:
provide, to the computing device an initialization period before the sensor provides the output signal, a first TEDS calibration template indicative of the first variable of the sensed property; and
provide, to the computing device an initialization period before the sensor provides the output signal, a second TEDS calibration template indicative of the second variable of the sensed property.

18. The non-transitory computer-readable medium of claim 17, wherein each of the first TEDS calibration template and the second TEDS calibration template is a calibration table TEDS template.

19. A method of operating a sensing system being coupled to a computing device and including a sensor, the method comprising:
providing an output signal from the sensor indicative of a sensed property;
providing, to the computing device an initialization period before the sensor provides the output signal, a first Transducer Electronic Data Sheet (TEDS) template indicative of a first variable of the sensed property; and
providing, to the computing device an initialization period before the sensor provides the output signal, a second TEDS template indicative of a second variable of the sensed property.

20. The method of claim 19, further comprising:
providing, to the computing device an initialization period before the sensor provides the output signal, a first TEDS calibration template indicative of the first variable of the sensed property, the first TEDS calibration template being paired with the first TEDS template; and
providing, to the computing device an initialization period before the sensor provides the output signal, a second TEDS calibration template indicative of the second variable of the sensed property, the second TEDS calibration template being paired with the second TEDS template.

* * * * *